United States Patent [19]

Lee et al.

[11] Patent Number: 5,591,674
[45] Date of Patent: Jan. 7, 1997

[54] INTEGRATED CIRCUIT WITH SILICON CONTACT TO SILICIDE

[75] Inventors: Kuo-Hua Lee, Lower Macungie Township; Chen-Hua D. Yu, Allentown, both of Pa.

[73] Assignee: Lucent Technologies Inc., Murray Hill, N.J.

[21] Appl. No.: 814,952

[22] Filed: Dec. 30, 1991

[51] Int. Cl.$^6$ .......................... H01L 21/265; H01L 21/283
[52] U.S. Cl. ............................ 437/193; 437/200; 437/20; 748/DIG. 147
[58] Field of Search .................................. 437/200, 191, 437/193, 52, 20, 26, 101; 148/DIG. 147; 357/675, 715

[56] References Cited

U.S. PATENT DOCUMENTS

| | | | |
|---|---|---|---|
| 4,523,370 | 6/1985 | Sullivan et al. | 937/193 |
| 4,569,121 | 2/1986 | Lim et al. | 437/200 |
| 4,569,122 | 2/1986 | Chan | 357/71 S |
| 4,581,623 | 4/1986 | Wang | 357/23.7 |
| 4,727,045 | 2/1988 | Cheung et al. | 437/47 |
| 5,010,037 | 4/1991 | Lin et al. | 437/200 |
| 5,025,741 | 6/1991 | Suwanai et al. | 437/52 |

FOREIGN PATENT DOCUMENTS

| | | |
|---|---|---|
| 0-394665 | 10/1990 | European Pat. Off. . |
| 1-196863 | 8/1989 | Japan . |
| 1-241168 | 9/1989 | Japan . |
| 2-288361 | 11/1990 | Japan . |

OTHER PUBLICATIONS

"A Large Cell–Ratio and Low Node Leak 16M–bit SRAM Cell", by K. Yuzuriha et al., pp. 485–488., IEDM Tech. Dig., Dec. 1991.

"Low Threshold Stacked CMOS Devices Utilizing Self--Aligned Silicide Technology", IBM Tech. Disc. Bull., vol. 28, No. 4, Sep. 1985, pp. 1431–1432.

Wolf, S., et al., Silicon Processing for the VLSI Era, vol. 1, Process Technol., Lattice Press, 1986, pp. 283–308, 384–387.

Primary Examiner—T. N. Quach
Attorney, Agent, or Firm—Richard D. Laumann

[57] ABSTRACT

An integrated circuit is described which has an electrical contact formed between a metallic silicide and $\alpha$:Si. The method of integrated circuit manufacturing comprising the steps of: forming a layer of a metallic silicide; depositing a layer of $\alpha$:Si on said metallic silicide at a temperature less than the recrystallization temperature; and increasing the conductivity of at least selected portions of said $\alpha$:Si by ion implanting a species having the peak of its spatial distribution spaced from the $\alpha$:Si-Silicide interface and the $\alpha$:Si surface.

8 Claims, 1 Drawing Sheet

INTEGRATED CIRCUIT WITH SILICON CONTACT TO SILICIDE

TECHNICAL FIELD

This invention relates to the field of integrated circuits having electrical contacts between silicon and a silicide.

BACKGROUND OF THE INVENTION

Integrated circuits have many devices which must be electrically connected to each other. The size of the circuits is presently such that all of the electrical interconnections can not be on the same level. Rather, the electrical interconnections are on different levels which are separated from each other by a layer of a dielectric. Contacts between levels are made by patterning the dielectric to form windows which expose portions of the underlying interconnect material and then filling the window with a conducting material, etc. Of course, contacts are made for other reasons as well such as the contacts made to source/drain regions and the gate of a field effect transistor.

A frequently used material for the electrical interconnect is a metallic silicide such as titanium silicide. This material has a conductivity higher than that of polysilicon and is also frequently used on the source/drain regions and the gate structure. A desirable contact material to be used with a metallic silicide is polysilicon because it is inexpensive and easily formed. A typical process sequence forms the silicide, deposits and patterns a dielectric layer to expose selected portions of the underlying silicide, and deposits polysilicon at a temperature greater than 600° C. See the paper, *IEDM, 1991, "A Large Cell-Ratio and Low Node Leak 16M–bit SRAM Cell,"* by K. Yuzuriha et al., pp. 485–488, for a description of a polysilicon-silicide contact. This process sequence may also include ion implantation of a dopant, such as arsenic at an energy of approximately 100 Kev, to increase conductivity, and a rapid thermal anneal, typically approximately 20 seconds, at a temperature of approximately 900° C. to activate the dopants. Patterning of the polysilicon and deposition of another dielectric frequently follows. The deposition temperature for this dielectric is frequently above 600° C. to obtain adequate throughput.

However, when the material in the opening in the dielectric is examined carefully, it is found that there are spikes. The composition of the spikes is not known with certainty; however, it is believed that their primary constituent is silicon. Regardless of their precise composition, they adversely affect the quality of electrical contacts. For example, they may reduce the space available for the contact areas thereby increasing the contact resistance, and, if they are too high, penetrate a subsequently deposited dielectric and cause electrical shorts. Their elimination would therefore be desirable.

SUMMARY OF THE INVENTION

A method of integrated circuit manufacturing which forms electrical contacts to a metallic silicide by depositing a layer of α:Si (amorphous silicon) at a temperature less than the recrystallization temperature. This temperature is approximately 575° C. In an exemplary embodiment, a dielectric layer is deposited and patterned to expose selected portions of the silicide before the α:Si is deposited. In a preferred embodiment, at least portions of the α:Si have their conductivity increased by ion implanting with a species having the peak of its spatial distribution separated from the α:Si-silicide interface and the α:Si surface. The energy selected will depend upon the thickness of the α:Si. A desirable choice is P. In yet another preferred embodiment, the metallic silicide comprises titanium silicide.

For reasons of clarity, the elements depicted are not drawn to scale.

DETAILED DESCRIPTION

Figure 1:
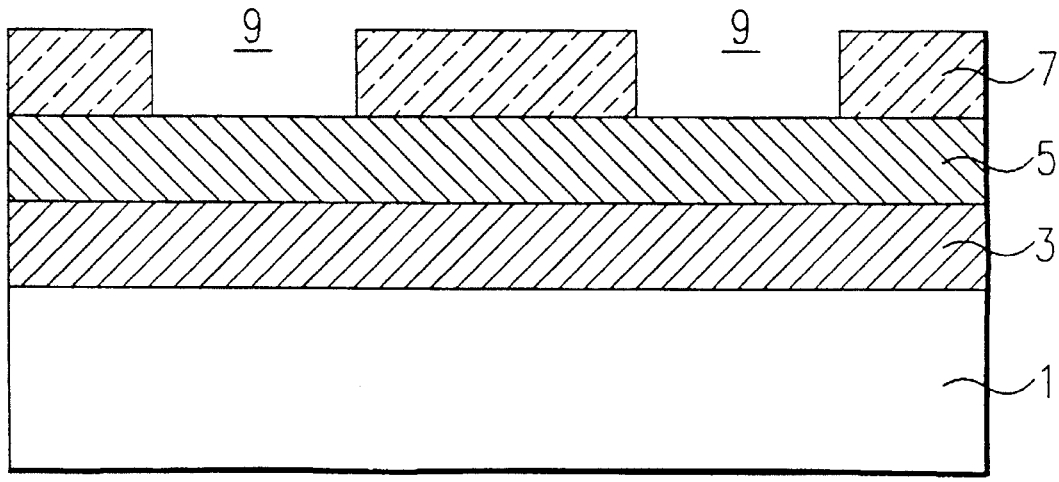
FIGS. 1 and 2 are sectional views of an integrated circuit at several stages in manufacture according to this invention.

The invention will be described by reference to a particular embodiment. Depicted in FIG. 1 are substrate 1, silicon layer 3, metallic silicide layer 5, and dielectric layer 7. Layer 7 has been patterned to form windows 9 which expose selected portions of layer 5. The term substrate is used to mean any material that lies underneath and supports another material. It thus includes the silicon wafer, with or without an epitaxial layer, an oxide such as a deposited oxide or a field oxide, etc. The silicon layer may comprise single crystal silicon or it may comprise polysilicon. It may be doped or undoped. The silicide is selected from the group consisting of metallic silicides which includes titanium silicide. Functions contemplated for the silicide and underlying silicon include local interconnects, source/drain regions, gate structures, etc. The dielectric layer composition is not critical; it comprises a dielectric which can be deposited and patterned to form windows which expose selected portions of the silicide layer 5. The structure depicted will be readily fabricated by those skilled in the art without further description.

A layer 11 of amorphous silicon is now deposited at a temperature less than the recrystallization temperature which is approximately 575° C. The material will, for reasons of description, be referred to as α:Si, although there may be small regions that are not truly amorphous. This material is well known and those skilled in the art will be able to select an appropriate deposition technique.

Figure 2:
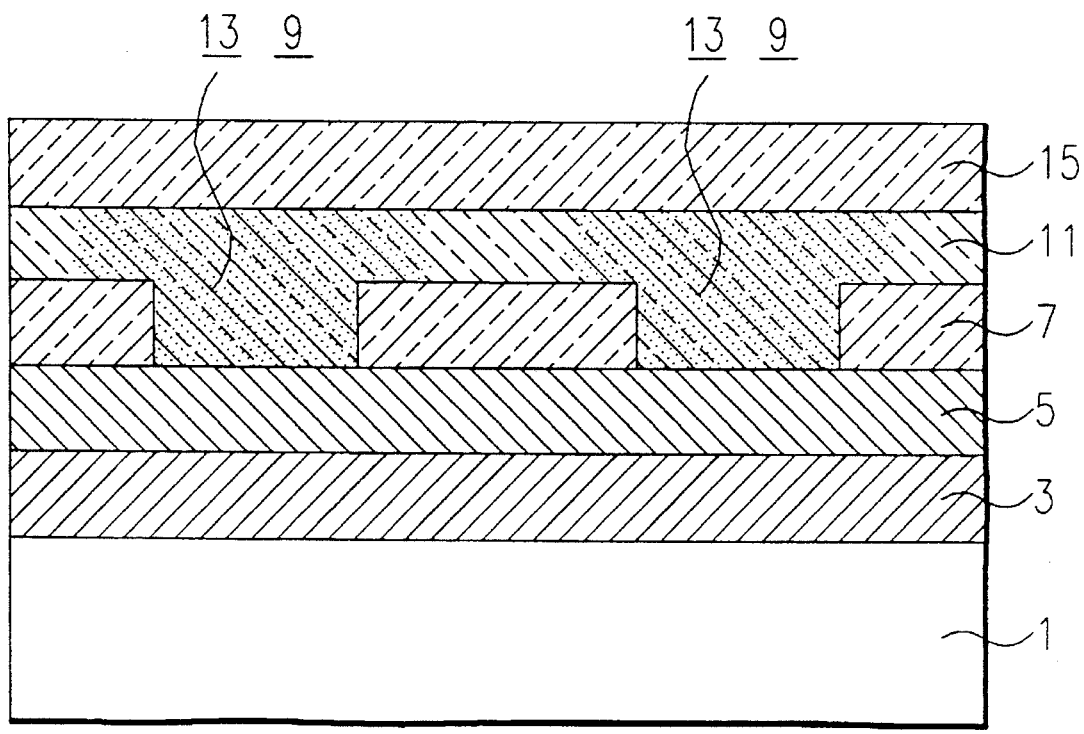

Further semiconductor integrated circuit processing is now performed. Ion implantation is used to increase the conductivity of at least portions of regions 11. The regions with increased conductivity are indicated as 13. It will be appreciated that not all of the α:Si need be implanted; non-implanted regions may be used as, for example, resistive elements or capacitor dielectrics. An exemplary dopant is P implanted at an energy less than 50 Kev for α:Si having a thickness of 1200Å; 35 Kev is a typical energy. A rapid thermal anneal may be performed after implantation for dopant activation. The annealing temperature is desirably less than 800° C. This processing is followed by deposition of another dielectric layer 15. The resulting structure is depicted in FIG. 2.

Fewer spikes were observed when silicon was deposited at temperatures below the recrystallization temperature than above it, and no spikes were observed at temperatures less than 550° C. Better electrical contacts between the silicon and the silicide were obtained than with the higher temperature silicon deposition. The reason for suppression of spike growth is not known with certainty, but is believed explained by the following considerations. It is believed that the silicide layer is nonuniform after the overlying dielectric layer has been deposited at a temperature greater than 600° C. and then patterned to expose the portion of the silicide in the window. The nonuniformities may be variations in layer characteristics, such as thicknesses after the overlying dielectric deposition and the window etch. The high temperature is also likely to produce silicide agglomeration. Additionally, the silicide formation process may also produce some variations in characteristics. In any case, silicon or silicon rich areas are exposed when the polysilicon deposition begins. It is hypothesized that the spikes are the result of solid phase epitaxial growth during the polysilicon deposition. Additionally, the ion implantation step may affect the structure of the polysilicon near the polysilicon-silicide interface when the spatial peak of the implant distribution is near the interface as it typically is for the As implant previously described. During either the rapid thermal anneal or the dielectric layer deposition, further solid phase epitaxial growth of silicon may also occur.

Silicon deposition at a temperature less than 575° C. makes solid phase epitaxial growth energetically unfavorable and it does not occur to an extent sufficient to produce visible spikes when the contact regions are examined by electron microscopy. Choice of a lower implant energy and a lighter species, P rather than As, reduces the amount of damage done to the materials near the siliconsilicide interface and the α:Si surface. It is desirable that the implanted species and its energy be selected so that the spatial peak of the implant distribution is spaced from the α:Si-silicide interface and the α:Si surface. Of course, the energy must be sufficiently high so that rite dopants, are not too shallow. If they are too shallow, they may evaporate during the anneal. The reduced damage near the interface makes the solid phase epitaxial growth less energetically favored.

Variations in the embodiment described will be readily apparent to those skilled in the art. For example, although contact formation on only a single level was described, the method described may be used on two or more levels.

We claim:

1. A method of integrated circuit manufacturing comprising the steps of:

forming a layer of a metallic silicide;

depositing a layer of α:Si on said metallic silicide at a temperature less than the recrystallization temperature; and increasing the conductivity of at least selected portions of said α:Si by ion implanting a species having the peak of its spatial distribution spaced from the α:Si-silicide interface and the α:Si surface.

2. A method as recited in claim 1 comprising the further step of depositing and patterning a layer comprising a dielectric before said α:Si is deposited.

3. A method as recited in claim 2 in which said species is at least one member selected from the group consisting of P and As.

4. A method as recited in claim 3 in which said species is P.

5. A method as recited in claim 3 comprising the further step of annealing with a rapid thermal anneal.

6. A method as recited in claim 5 in which said rapid thermal anneal is at a temperature less than 900° C.

7. A method as recited in claim 1 in which said metallic silicide comprises titanium silicide.

8. A method as recited in claim 1 in which said layer of a metallic silicide is formed on polysilicon.

* * * * *